April 7, 1959 B. GOLDBERG 2,881,320

VARIABLE FREQUENCY HIGH STABILITY OSCILLATOR

Filed June 7, 1957 2 Sheets-Sheet 1

INVENTOR,
BERNARD GOLDBERG

BY
Harry M. Saragovitz
ATTORNEY.

*INVENTOR,*
BERNARD GOLDBERG
*BY*
Harry M. Saragovitz
ATTORNEY.

2,881,320
Patented Apr. 7, 1959

2,881,320

VARIABLE FREQUENCY HIGH STABILITY OSCILLATOR

Bernard Goldberg, Wanamassa, N.J.

Application June 7, 1957, Serial No. 664,448

2 Claims. (Cl. 250—36)

(Granted under Title 35, U. S. Code (1952), sec. 266)

The invention described herein may be manufactured and used by or for the Government for governmental purposes, without the payment of any royalty thereon.

This invention relates to a circuit for use with an oscillator. More particularly, this invention relates to a means for varying the effective output frequency of a highly stable oscillator.

In the prior art there are innumerable forms of oscillators. Some may be varied in frequency by varying one or more of the elements upon which the frequency of the oscillator is dependent. These oscillators may cover a relatively wide range of frequencies but, because of the limited precision of variable components, it is difficult to get the highest degree of stability in the variable type of oscillators.

Other forms of oscillators may have extremely precise electrical and mechanical elements encapsulated and thermostabilized to provide a nearly constant single output frequency. Crystals or other devices may also be incorporated to provide an extremely high degree of stability, but only at specific output frequencies. These forms of oscillators provide the maximum possible stability of frequency but can provide little or no frequency adjustment.

It is therefore an object of this invention to provide an improved oscillation generating system of high stability that may be varied in frequency.

It is a further object of this invention to provide a means for making precise, minute variations in the output frequency of a highly stable oscillator.

It is a further object of this invention to provide a precise means for varying the effective output frequency of a very stable oscillator.

These and other objects of this invention are realized by phase shifting the output of an oscillator to obtain a series of separate output signals of the same frequency but of progressively varying phase relationship. These are fed into separate gating circuits so that any one of the output signals may be applied to a common output. A means for energizing each of the gating circuits in sequence causes progressive changes in the phase, or an effective change in the frequency, of the common output.

This invention is more particularly described and other and further objects of this invention will become apparent from the following specification and drawings wherein.

Figure 1:
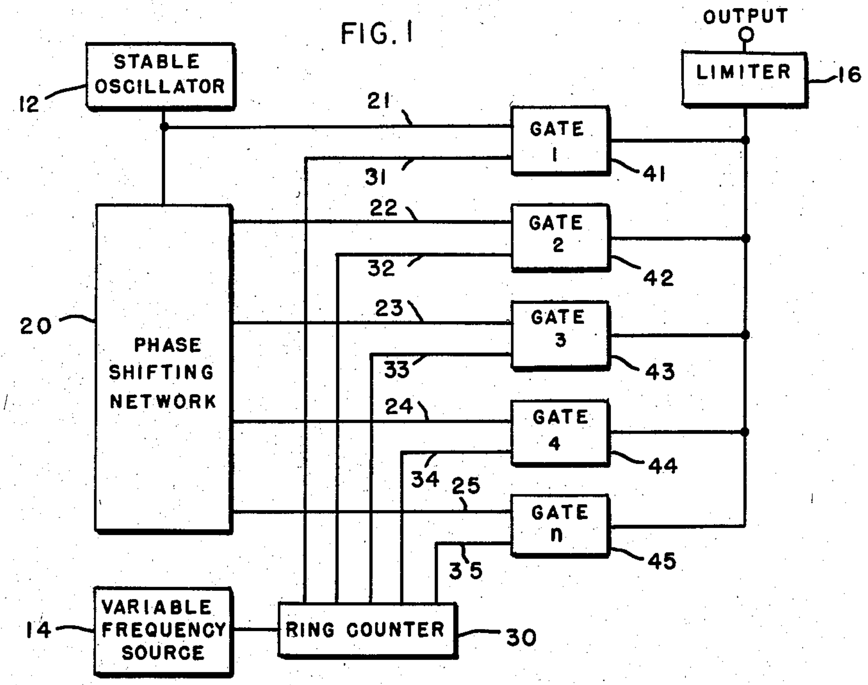
Figs. 1 and 2 show block diagrams of the invention.

Referring now more particularly to Fig. 1, a stable oscillator 12 is connected to a gating circuit 41 and to a phase shifting network 20 which has outputs 22 to 25. These outputs are connected to the gating circuits 42 through 45, respectively. The outputs of these gates are combined and fed into a common output circuit through limiter 16.

A frequency source 14 is connected to the ring counter 30 which has separate outputs 31 through 35 which are connected to the corresponding controls of the gating circuits 41 through 45.

Figure 2:
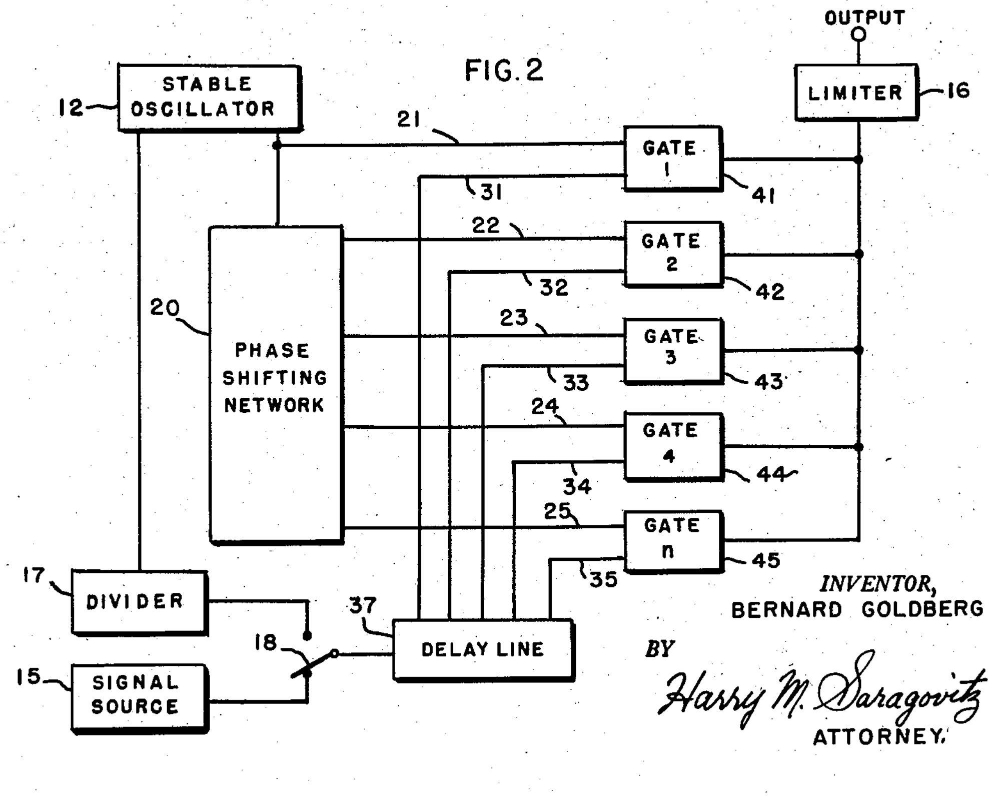

Fig. 2 shows another variation of this circuit wherein similar elements have the same numbers and the same functions. In this circuit the ring counter is replaced by a delay line 37 which provides a series of successive pulses which are applied to the gating circuits through output connections 31 to 35.

The pulse actuating the delay line may be taken from any suitable signal source such as 15.

Another source of signals to actuate the delay line 37 is the stable oscillator 12, with its frequency reduced to the desired fraction by the frequency divider 17.

Figure 3:
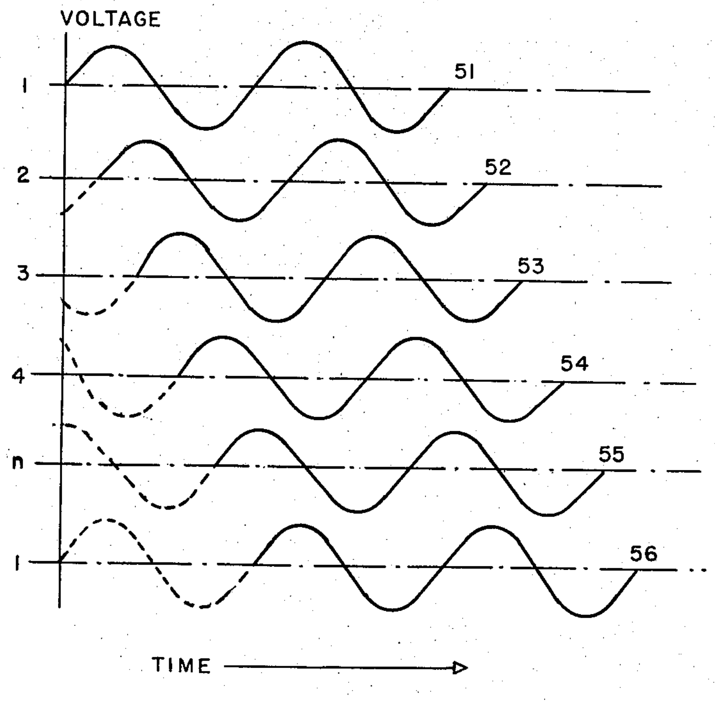
Fig. 3 shows a series of waveforms illustrating the operation of the invention.

In operation the stable oscillator 12 provides a constant frequency such as is shown in curve 51 of Fig. 3. This constant frequency is fed to the phase shifting or phase splitting network 20 which will delay the frequency of the stable oscillator by successive increments to provide several separate sources of the identical frequency to that of the stable oscillator 12 but each uniformly phase displaced by equal fractions of 360°. These separate frequency sources are the outputs 21 through 25 of the phase shifting network. The typical waveforms of the separate frequency sources are shown in Fig. 3 where curves 51 through 55 correspond to the outputs 21 through 25. It is noted that the sixth curve 56, is in fact identical to curve 51, 360° displaced.

One of the gates 41 through 45 is open at a time and the output frequency passing through any of the gates will be identical to that of any of the other gates. However, if the gates shown are successively switched through the five gates and back to the original gate, the output signal will have been effectively changed by one cycle; if the gates are successively switched through all five units and back to the original in one second the frequency at the output of the limiter 16 will appear to be one cycle less during that second. Conversely, if the order of switching is 5, 4, 3, 2, 1, according to the phase relationship chosen and shown in Fig. 3, the output frequency will appear to have gained one cycle.

In the same way the gating circuits may be successively switched at faster rates, for example, thousands of times per second, and on into the limit of electronic switching devices to provide variation in frequency of considerable latitude.

The most practical means of providing the gating control impulses is by means of the ring counter of Fig. 1, which is similar to that shown in the Radiation Laboratory Series, vol. 19, on Waveforms, published by McGraw-Hill. On pages 602 through 603, of this book, a typical circuit is described wherein a series of multivibrators are successively actuated by a common input pulse. The multivibrators are bistable and are so biased that only one is an "on" condition and all the others are in an "off" condition. The common input pulse from the frequency source 14 will switch the succeeding multivibrator to the "on" condition and restore the one multivibrator to the "off" condition. The number of multivibrators to be used here would be equal to the number of gating circuits required and a variable oscillator of any form could provide uniform sequential pulses to actuate the ring counter.

Another method for providing the gating control is shown in Fig. 2. Here a delay line 37 is constructed to provide a series of equi-spaced pulses to the control outputs 31 to 35 in succession to actuate the corresponding gating circuits 41 to 45.

The delay line is a simple and positive means for obtaining equispaced pulses but it is normally of fixed pulse spacing. This would be used with a fixed input frequency from the signal source 15 or the divider 17. The fixed input frequency would be such that it would re-energize the delay line at the given fixed pulse spacing after the last pulse has been transmitted through its control line.

The fixed input frequency can also be obtained from the original stable oscillator 12, suitably divided down in 17 in a manner well known in the art to any desired submultiple of the stable oscillator. This would provide a signal source having the same very high stability and having constant pulse relationship with respect to the stable oscillator.

The frequency of the signal source 15 could also be locked into a constant phase relationship with the stable oscillator 12 by techniques well known in the art.

A switch 18 may be provided to select either of the signal sources available. This will allow rapid change of frequency with precise control over a relatively small range of frequencies as in frequency switch keying. Two or more sources may be used and, for more flexibility, both a divider source such as 17 and independent source such as 15 could be used at the same time.

Still another method of generating equi-spaced pulses for the gating control is with a series of monostable multivibrator elements connected in a ring commutator formation with one element refiring the next element and the last element refiring the first one. Each element would be connected to one of the control lines 31—31.

The value of this circuit lies in the fact that a variable low frequency, which can be stabilized, is added to or subtracted from a fixed high frequency which can also be maintained highly stable. If the same high frequency were made variable by conventional circuitry it could not achieve this stability. This invention combines the precision of a fixed frequency oscillator with the flexibility of a variable frequency oscillator.

Preferably, the time constants of the gates may be adjusted so that their outputs overlap to any desired degree to avoid harmonic peaks and switching transients and to permit a gradual change from one phase to the succeeding phase. A limiter is preferably provided in the output to minimize output amplitude variation.

If a constant frequency shift is desired a simple delay line of suitable delay with a number of outputs corresponding to the number of gates may be provided in place of the ring counter. This delay line may be actuated by an oscillator of the given constant frequency, or the delay line may be reactuated by its own pulse when it reaches the last increment of the delay.

While we have shown only five gating elements in this description to retain simplicity while clearly showing the function, it is obvious that many more gates may be provided with correspondingly less phase shift per gate and considerably smoother switching and output waveform. A fewer number of gates and phase displacements may also be used but the distortion will be correspondingly greater in the system taught herein.

According to the sequence of the phases shown in Fig. 3, if the gates are switched in numerical sequence the frequency at the output 16 will be reduced. If the gates are switched in reverse numerical sequence the frequency at the output will be increased by the corresponding amount.

What is claimed is:

1. A circuit for use in conjunction with a fixed frequency oscillator for obtaining a variable frequency from said fixed frequency oscillator, comprising; phase shifting means connected to the output of said oscillator; said phase shifting means having more than two signal output terminals providing an equal number of signals of said fixed frequency, of constant amplitude, and of equal, progressive increments of phase difference; a gating circuit connected to each of said plurality of signal output terminals, means for producing a uniform series of gating pulses, said last means having an equal number of pulse output terminals; each of said pulse output terminals being connected to one of said gating circuits, an output circuit for each of said gating circuits; and a common limiting means for combining the output circuits of all said gating circuits.

2. A circuit for use in conjunction with a fixed frequency oscillator for obtaining a variable frequency from said fixed frequency oscillator as in claim 1 wherein said means for producing a uniform series of gating pulses comprises a ring counter, said ring counter being actuated by a variable frequency source to provide a continuously variable control of said variable frequency.

References Cited in the file of this patent

UNITED STATES PATENTS

| | | |
|---|---|---|
| 2,513,910 | Bliss | July 4, 1950 |
| 2,766,379 | Pugsley | Oct. 9, 1956 |
| 2,767,312 | Toulon | Oct. 16, 1956 |